United States Patent [19]

Lin

[11] Patent Number: 5,275,913
[45] Date of Patent: Jan. 4, 1994

[54] METHOD FOR PREPARING RESIST PATTERNS UTILIZING SOLVENT DEVELOPMENT WITH SUBSEQUENT RESIST PATTERN TRANSFER, VIA A PHOTO-HARDENING LIQUID ADHESIVE, TO A RECEIVER SUBSTRATE AND OXYGEN REACTIVE ION ETCHING

[75] Inventor: Dhei-Jhai Lin, Hsinchu, Taiwan

[73] Assignee: Industrial Technology Research Institute, Taiwan

[21] Appl. No.: 56,617

[22] Filed: May 4, 1993

Related U.S. Application Data

[63] Continuation of Ser. No. 729,881, Jul. 11, 1991, abandoned, which is a continuation of Ser. No. 520,184, May 8, 1990, abandoned.

[51] Int. Cl.$^5$ .......................... G03F 7/30; G03F 7/36; G03F 7/40
[52] U.S. Cl. ............................. 430/252; 430/258; 430/325; 430/326; 430/328
[58] Field of Search ............... 430/252, 258, 325, 326, 430/328

[56] References Cited

U.S. PATENT DOCUMENTS

| | | | |
|---|---|---|---|
| 3,650,740 | 3/1972 | Van Paesschen | 430/258 |
| 3,721,557 | 3/1973 | Inoue | 430/293 |
| 4,104,070 | 8/1978 | Moritz | 430/191 |
| 4,196,003 | 4/1980 | Watanabe | 430/191 |
| 4,357,369 | 11/1982 | Kilichowski | 430/313 |
| 4,396,704 | 8/1983 | Taylor | 430/311 |
| 4,433,044 | 2/1984 | Meyer | 430/313 |
| 4,506,004 | 3/1985 | Sullivan | 430/257 |
| 4,552,833 | 11/1985 | Ito | 430/313 |
| 4,613,398 | 9/1986 | Chiong | 430/314 |
| 4,614,706 | 9/1986 | Matsuzawa | 430/167 |
| 4,835,089 | 5/1989 | Iwayanagi | 430/167 |

FOREIGN PATENT DOCUMENTS

| | | |
|---|---|---|
| 0187421 | 7/1986 | European Pat. Off. . |
| 0261315 | 3/1988 | European Pat. Off. . |
| 1912864 | 12/1969 | Fed. Rep. of Germany . |

*Primary Examiner*—Charles L. Bowers, Jr.
*Assistant Examiner*—Christopher G. Young
*Attorney, Agent, or Firm*—Cushman, Darby & Cushman

[57] ABSTRACT

A method of preparing a fine pattern on a substrate characterized by the dry development of a photoimaged, etch resistant pattern on a receiver substrate. The pattern is transferred from a carrier substrate to the receiver substrate via a hardenable liquid adhesive. This method eliminates adverse reflection effects caused from substrate topography in single layer photoresist systems and also avoids time consuming multiple coatings in multilayer photoresist systems used to make fine patterns. The method is particularly useful in the fabrication of integrated circuits and fine dimension patterns.

6 Claims, 9 Drawing Sheets

METHOD FOR PREPARING RESIST PATTERNS UTILIZING SOLVENT DEVELOPMENT WITH SUBSEQUENT RESIST PATTERN TRANSFER, VIA A PHOTO-HARDENING LIQUID ADHESIVE, TO A RECEIVER SUBSTRATE AND OXYGEN REACTIVE ION ETCHING

This is a continuation of U.S. patent application Ser. No. 07/729,881, filed on Jul. 11, 1991, which was abandoned upon the filing hereof, which is a continuation of U.S. patent application Ser. No. 07/520,184, filed on May 8, 1990, which was abandoned upon the filing hereof Jul. 11, 1991, now abandoned.

BACKGROUND OF THE INVENTION

The present invention relates to a method of preparing an etch resistant pattern on a substrate. In particular, this invention relates to a method of physically transferring a preformed pattern to a substrate. The method is useful in the formation of micro-patterns and in the fabrication of integrated circuitry.

In the fabrication of integrated circuitry and micron-scale devices, patterns are generally defined by photolithography. In order to define a pattern on a semiconductor wafer, a photoresist is used to produce a resist pattern on the substrate prior to image forming modifications of the substrate material, such as vapor deposition, ion implantation or etching.

Photoresist material is commonly applied to a wafer substrate by spin coating and is then dried to produce a thin film with a thickness of about 1 μm. This dried film is subjected to photo imaging, for example, pattern reproduction from a mask in a photo printer. Various types of photo printers are used in the industry. One type of photo printer is a contact printer, where the photoresist layer is in direct contact with the pattern carrying mask. This method, which minimizes diffraction of light, provides the best image reproduction. However, the possibility of damage to the mask, and the difficulty in its alignment, limit the applications of this method.

Another type of photo printer is a projection printer. In this type of printer delicate optics are used to project the pattern from the mask onto the photoresist layer on the substrate. During the fabrication of fine line patterns, by the method, light diffraction problems are minimized through the use of reduction projection optics and an enlarged mask pattern. The magnitude of the reduction is usually by a factor of five or ten. However, such a method also shrinks the imaging field. Therefore, a step and repeat imaging mode with lower throughput is required. This type of projection printer also provides accurate overlay alignment and is capable of sub-micron imaging when improvements on the higher numerical aperture value of the optical system are made and shorter radiation wavelength is used.

After patterning, the latent image in the photoresist layer is developed in an appropriate solvent. In a positive working photoresist layer, the exposed area is washed off by the developer, while in a negative working photoresist layer, the unexposed area is washed off in the developing stage. In general, positive photoresist layers are more widely used to achieve higher resolution capability.

A diazoquinone/novolac system has been the most widely used positive working photoresist material. Diazoquinone, a photo-active compound, is converted into indene carboxylic acid upon exposure to photo-radiation. This conversion allows the development of the photoresist film in an aqueous alkali solution.

In negative working photoresists polymerization occurs in the irradiated region which makes the material insoluble. The pattern is developed by removal of the non-polymerized portion of the photoresist layer. Typical negative type photoresist materials include azide-sensitized rubber, such as cyclized polyisoprene, and polyvinylcinnamate with benzothiazole as photo-sensitizer.

During the production of integrated circuits, the patterning of the photoresist and the subsequent processes are repeated several times on a semiconductor wafer substrate. The non-planar circuit pattern topography on the substrate results in a non-planar photoresist coating. This causes focusing problem during photo-imaging of the coating. The use of a planarization coating prior to the application of a photoresist layer or multiple coatings of photoresist minimizes this problem, at the expense of a slower production rate, due to the time consuming extra coating and drying steps. However, the variation of the thickness of photoresist layer on the substrate makes it difficult to control the pattern profile. Furthermore, the different photo-reflectivity of various materials and the scattering of the reflected radiation off of the substrate topography, creates problems with the side wall profile and results in dimension control of the photoresist line becoming difficult. As a consequence, side wall indentation, line width variation over step topography of the substrate, and standing wave effects are commonly encountered during conventional image formation. The inclusion of a radiation absorbing dye or the use of an antireflective undercoat has been shown to minimize the influence of the substrate but with the problems of reduced photo-sensitivity and a narrowed processing window.

In view of the above problems, the use of dry developing in conjunction with the concept of "top imaging" emerged. In dry developing, a selective plasma etching reaction replaces the traditional wet developing process. In the top imaging process, a pattern is defined in the top photoresist layer of a multilayer system or in the top surface region of a single layer photoresist.

In the multilayer process, usually a two or three layer design, a thin layer of photoresist usually is placed on top of planarization sublayers. The pattern is initially defined in the top layer photoresist by a conventional method, that is, by wet developing. In a two layer system, the top photoresist layer is oxygen plasma etch resistant. Thus, in subsequent plasma etching, particularly oxygen plasma etching or oxygen reactive ion etching, the exposed sublayer is etched off and the top pattern is translated down to the inorganic substrate. However, there are problems associated with intermixing the etch resistant photoresist layer and the sublayer. These problems lead to difficulties in pattern definition control.

In the three layer system, a barrier layer is used which is located between the top photoresist layer and the bottom planarization layer. The barrier layer can be made of an inorganic compound material, preferably silicon oxide, siloxane, silane or other metals. Once the top pattern is defined, the exposed portion of the second layer is removed, usually by fluorocarbon plasma etching or a wet etching method which does not attack the top photoresist layer. Dry developing is used to translate the pattern down to the substrate. Although the multilayer systems exhibit high resolution, they suffer from the drawback of time consuming multiple coatings.

As a result, simpler single layer photoresists which are capable of dry developing were created. An oxygen plasma etchable photoresist is rendered selectively etch resistant by the imagewise inclusion of an etch resistant material. This material is usually organo-metallic compound which is introduced after photo-patterning of the photoresist layer. The selective inclusion of the organo-metallic compound is aided by the photo-reaction which has occurred in the imaged area. A typical example is a diazoquinone/novolac photoresist system. In this system, the exposed area allows a silicon compound to penetrate into the photoresist surface. This reacts with the novolac resin to form an etch resistant thin layer which can withstand oxygen plasma or oxygen reactive ion etching treatment. The use of this method allows the photoresist layer to be photo-patterned only in the surface region and avoids the problem of reflection of radiation from the substrate. However, a planar photoresist surface is still required to avoid the previously noted focusing problem. As a result, multiple coatings of photoresist may be required to cover the substrate topography.

In general, these existing advanced microlithography methods still suffer from the problems for using 3 complicated multiple photoresist patterning on what is usually a non-planar substrate. In addition, time consuming problems of alignment and focusing in the step and repeat mode of a projection printer also exist.

SUMMARY OF THE INVENTION

The present invention simplifies the photoresist patterning process by providing a novel method which provides more accurate pattern reproduction with simple overlay registration while minimizing the influences of substrate topography.

The present invention relates to methods of preparing an etch resistant pattern on a substrate. More particularly, the present invention relates to methods of forming an etch resistant pattern on a receiver substrate where the etch resistant pattern is defined by a corresponding, preformed photoresist pattern. The preformed photoresist is formed on a carrier substrate and is then transferred to the receiver substrate by lamination of the two substrates using a hardenable liquid adhesive.

Various embodiments will be described in more detail. In general, the methods of the present invention comprise the following characteristic steps:
  (a) forming a photoresist layer on a flat transparent carrier substrate;
  (b) forming a photoresist pattern in the photoresist layer;
  (c) laminating the photoresist pattern bearing carrier substrate to a receiver substrate using a hardenable liquid adhesive in between the two substrates, with the photoresist side of the carrier substrate facing the receiver substrate;
  (d) hardening the liquid adhesive by heat or preferably by actinic photoradiation, and removing the carrier substrate to transfer said photoresist pattern to the receiver substrate;
  (e) dry developing the pattern onto the receiver substrate corresponding to that transferred from said carrier substrate by oxygen plasma or oxygen reactive ion etching.

DETAILED DESCRIPTION OF THE PREFERRED EMBODIMENT

Figure 1A:
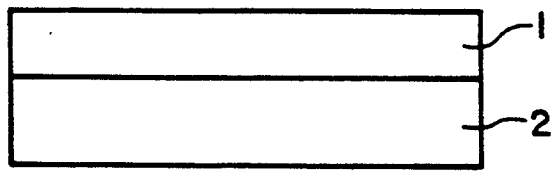
FIG. 1-A through 1-K demonstrates the process of the present invention using a photoresist material which is resistant to oxygen plasma etch conditions.
Figure 1B:
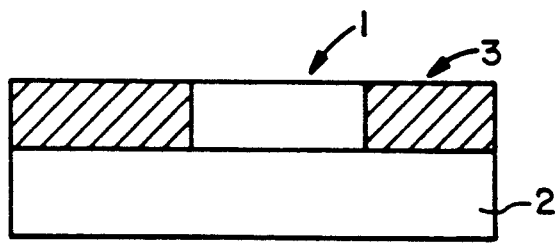
Figure 1C:
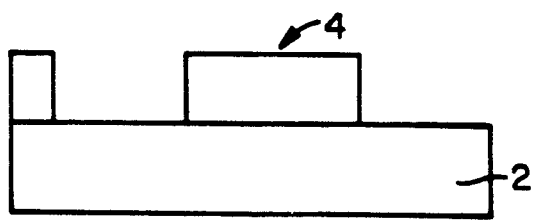
Figure 1D:
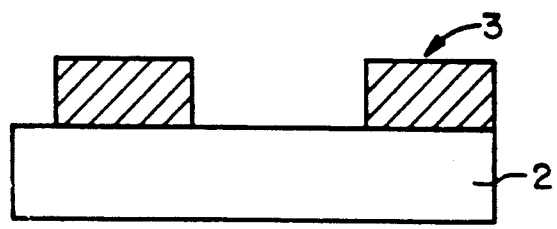
Figure 1E:
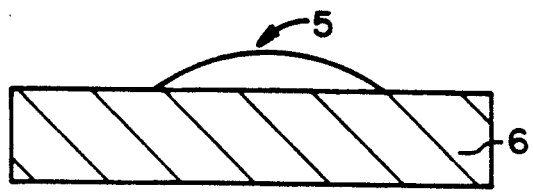
Figure 1F:
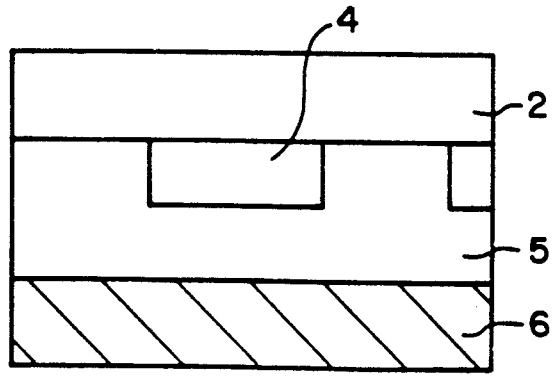
Figure 1G:
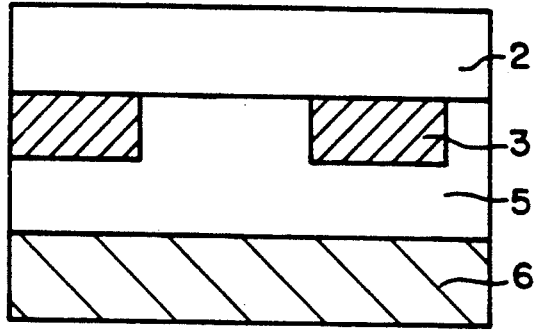
Figure 1H:
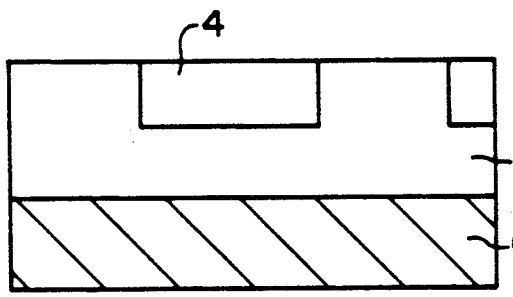
Figure 1I:
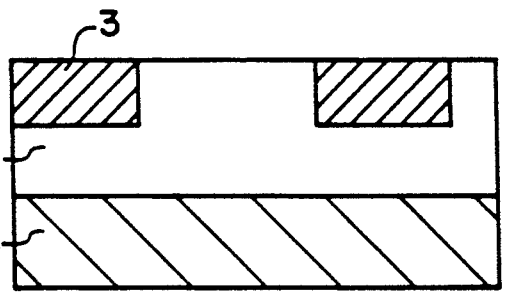
Figure 1J:
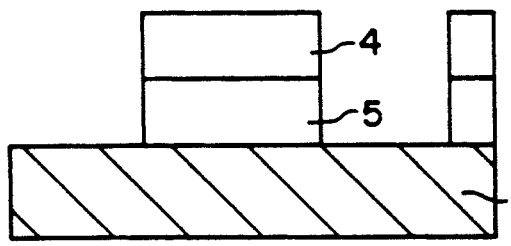
Figure 1K:
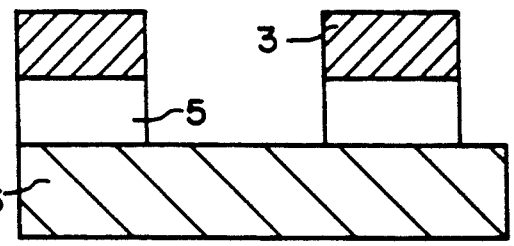
Figure 2A:
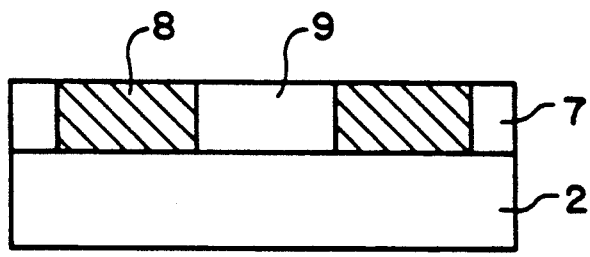
FIG. 2-A through 2-C demonstrates the process of the present invention when the photoresist is baked after exposure and is then photoirradiated.
Figure 2B:
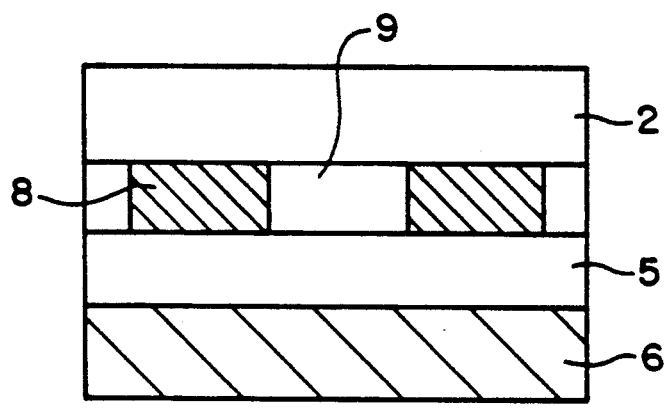
Figure 2C:
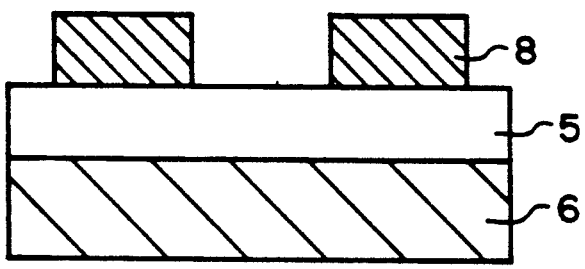
Figure 3A:
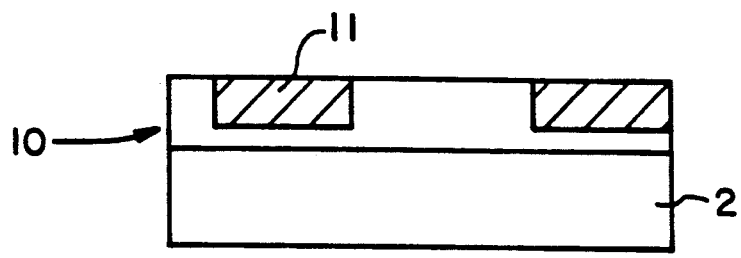
FIG. 3-A through 3-C discloses the use of image reversal and top imaging where the etch resistant material is present in the top of the photoresist layer but does not reach the bottom.
Figure 3B:
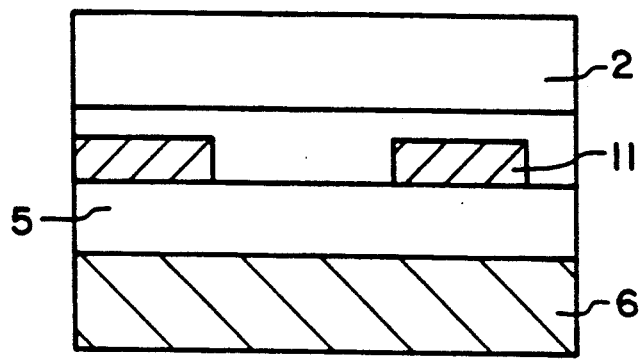
Figure 3C:
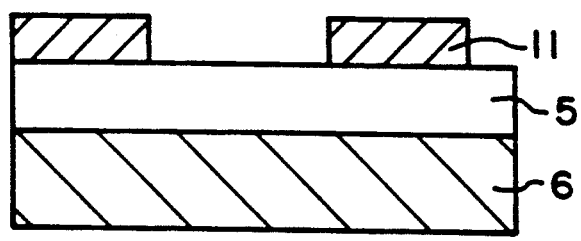
Figure 4A:
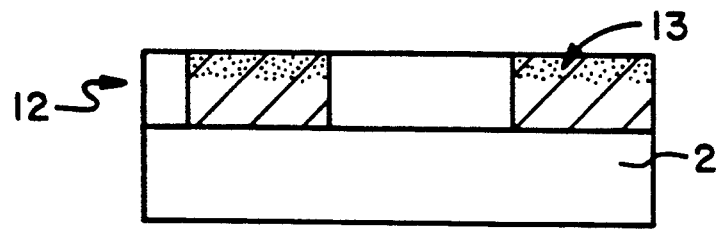
FIG. 4-A through 4-I shows the process using a non-etch resistant photoresist where the etch resistant material is selectively included before dry development.
Figure 4B:
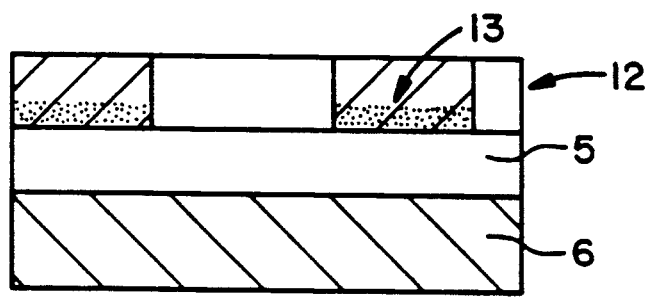
Figure 4C:
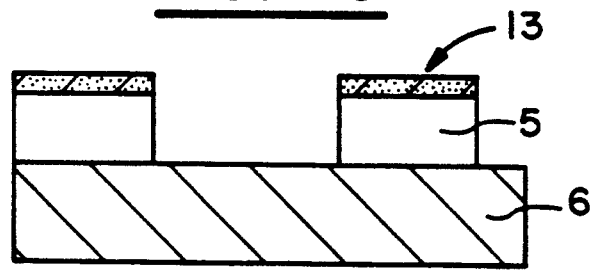
Figure 4D:
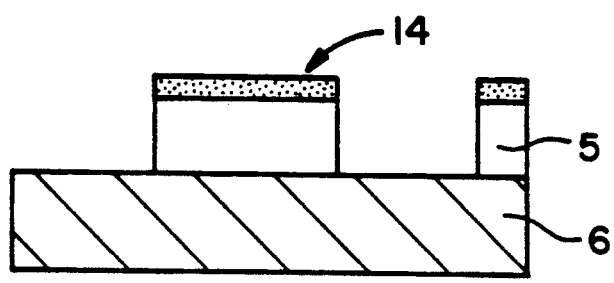
Figure 4E:
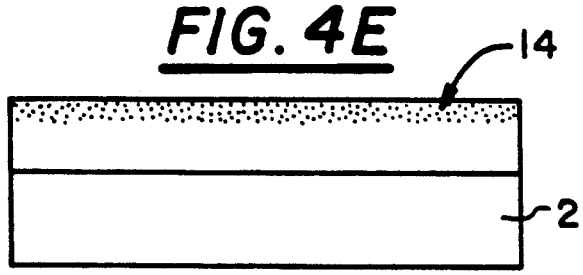
Figure 4F:
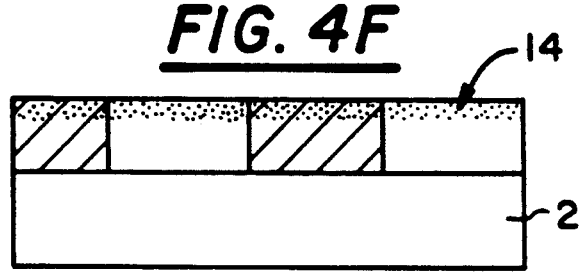
Figure 4G:
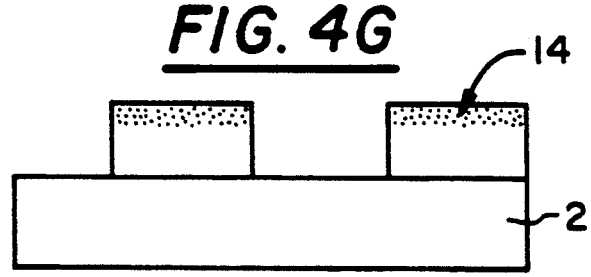
Figure 4H:
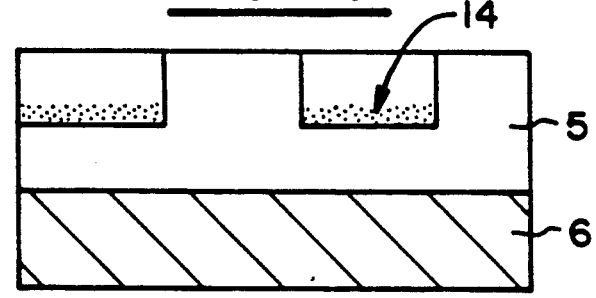
Figure 4I:
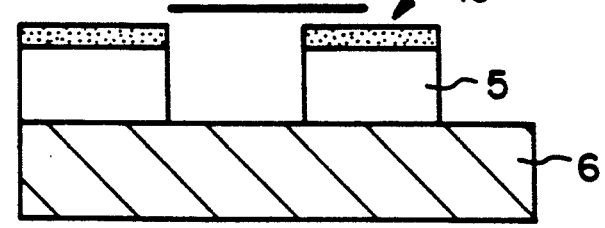
Figure 5A:
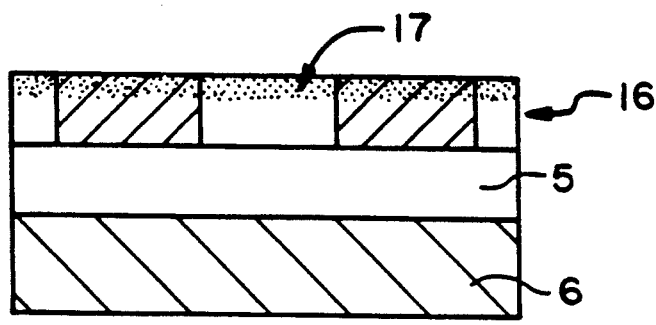
FIG. 5-A through 5-C demonstrates the method where the etch resistant layer is formed non-selectively in the outer surface region of the photoresist.
Figure 5B:
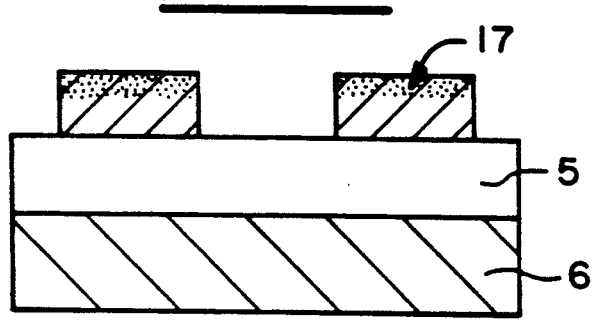
Figure 5C:
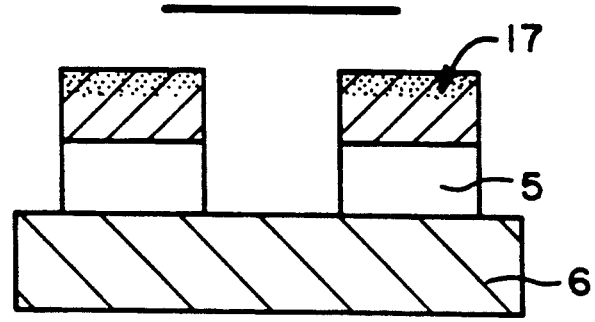
Figure 6A:
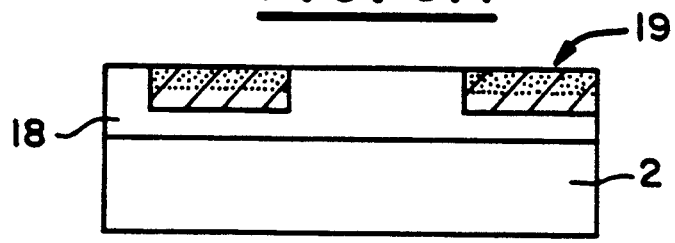
FIG. 6-A through 6-D discloses the use of the etch resistant material prior to a baking and image reversal development process.
Figure 6B:
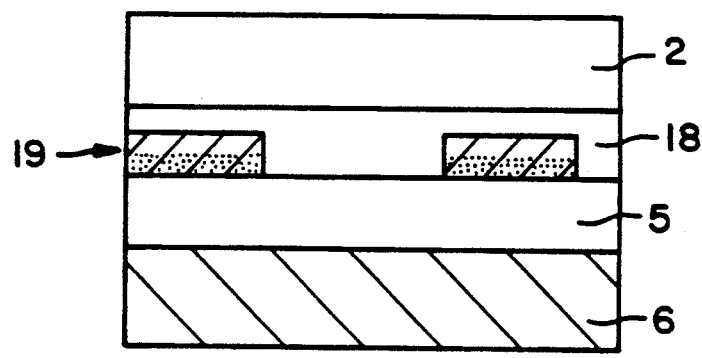
Figure 6C:
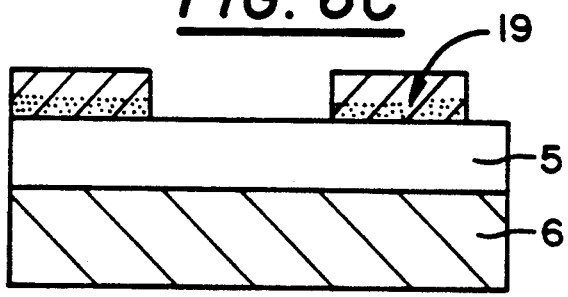
Figure 6D:
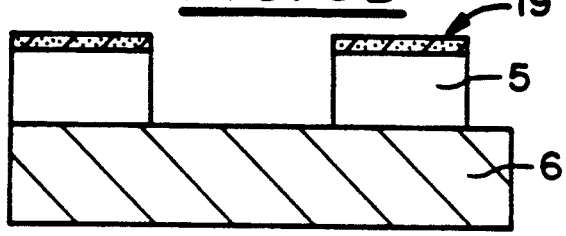
Figure 7A:
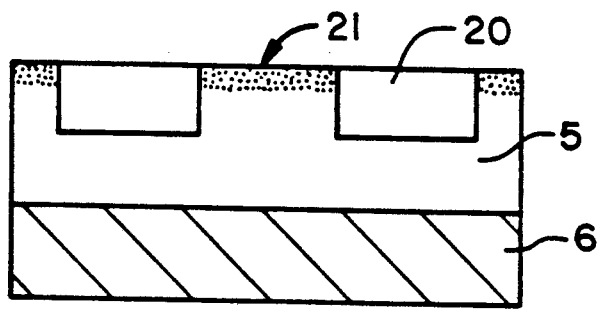
FIG. 7-A through 7-D shows the method of the present invention where the adhesive layer is embedded with the etch resistant material.
Figure 7B:
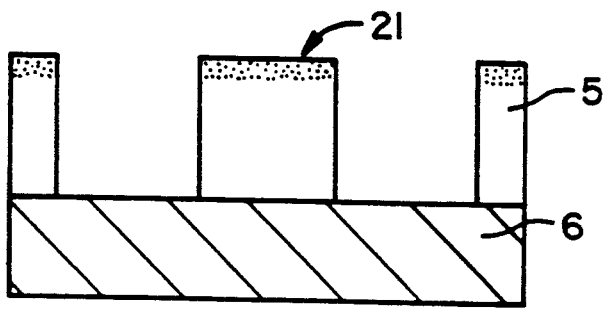
Figure 7C:
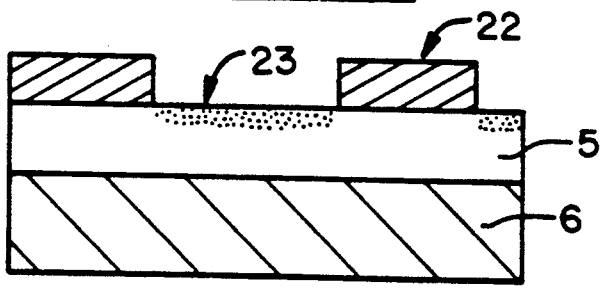
Figure 7D:
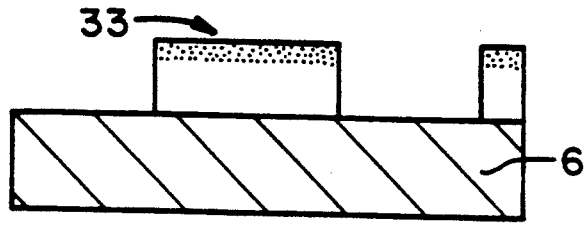

Various methods which consist of the above described five basic steps ((a)through (e)) may be used in forming an etch resistant pattern on a receiver substrate. These methods may differ slightly from each other in some details, particularly in the formation of etch resistant characteristics which will be described along with schematic representations in the following preferred embodiments:

A first embodiment comprises:
  (i) The formation of an etch resistant mask pattern by: applying a thin film (1) of etch resistant photoresist on a transparent, flat carrier substrate (2) as shown in FIG. (1-A); exposing the photoresist layer using photo-radiation sent through a photo mask, which provides a corresponding latent image in the photoresist layer as demonstrated in FIG. (1-B), where the shaded portion (3) represents the exposed area.

The exposed photoresist layer is developed to give an explicit pattern on the carrier substrate as shown in FIG. (1-C) for a positive working photoresist. In developing a positive working photoresist, the exposed portions are removed and the unexposed area (4) remains on the substance. FIG. (1-D) shows the same result for a negative working photoresist, where the exposed portions (3) of the photoresist remain on the substrate. The resulting pattern may optionally be subjected to additional hardening or stabilization processes such as exposure to ionizing radiation and/or heat.

In forming an etch resistant mask pattern on a carrier substrate, various conventional materials and methods are suitable for use in the present invention. Particularly preferred compounds are those employed in the fabrication of integrated circuits.

Photoresists containing inorganic compounds such as silicon, titanium or tin containing molecules, which form corresponding metal oxides in an oxygen plasma or oxygen reactive ion etching reaction, can be used to produce an etch resistant pattern on a flat carrier substrate by the conventional method of spin coating, imaging exposure and developing. Suitable/photo resists include commercially available photoresists which possess good resistance to oxygen reactive ion etching. These include, Hitachi RG8500P, and those described in the literature, such as "Semiconductor Lithography" Chap. 12 by W.M. Moreau, 1988, Plenum Press, New York, and U.S. Pat. Nos. 4,357,369, 4,433,044, 4,396,704. (incorporated by reference) Also suitable etch resistant photoresists can be formulated by incorporating conventional non-etch resistant photoresist, either positive or negative working, with said inorganic compounds such as silicon, titanium or tin containing compounds. The said conventional non-etch resistant photoresists are selected from those used in the fabrication of integrated circuitry. The said etch resistant inorganic compounds are preferred to be organometallic compounds containing silicon, titanium or tin atom and preferred to be nonreactive to imaging irradiation particularly when incorporated in a positive photoresist. The weight ratio of the metallic atom based on the dry photoresist film is preferred to be greater than 4% and up to the limit not to hinder the performance of the photoresist. A thin film photoresist with a thickness of less than 1 μm is preferred since higher resolution can be achieved with thinner photoresist layers. A dyed photoresist and an anti-reflection undercoating can also be used if the photo reflectivity of the carrier substrate is a concern.

A planarization layer, such as that used in multilayer photoresist systems can also be used on the carrier substrate, before coating the photoresist layer, as long as the planarization layer has a lower etching resistance. A relative etch resistance ratio of two or more, preferably five or more, is preferred between the etch resistant pattern and any non etch resistant layer or compound.

(ii) The physical transfer of the etch resistant mask pattern is accomplished by lamination of the pattern bearing carrier substrate, FIGS. (1-C) and (1-D), to a receiver substrate (6) using a liquid adhesive (5) as shown in FIG. (1-E). The liquid adhesive (5) may be placed on the receiver substrate (6) prior to the lamination with the pattern bearing carrier substrate. Alternatively, the liquid adhesive can be placed on the thin film pattern on the carrier substrate before lamination.

During lamination, pressure is applied to spread the liquid adhesive across the two substrates and to reduce the gap between the substrate to a desirable level, FIG. (1-F) and (1-G) demonstrate this for positive and negative photoresists, respectively. The gap between the two substrates may be optically monitored in conjunction with a pressure control. The size of the gap should preferably be no more than a few microns. The liquid adhesive may also be used as a lubricant for the relative motion of the two substrates for alignment, if necessary.

(iii) The fixtures shown in FIGS. (1-F) and (1-G) are then subjected to the hardening process for the liquid adhesive. This is either by exposure to heat or actinic radiation, e.g., ultra violet light, Once the adhesive is hardened, the carrier substrate is removed. This leaves the etch resistant pattern on the receiver substrate as shown in FIGS. (1-H) and (1-I), corresponding to the patterns shown in FIGS. (1-F) and (1-G) respectively. The removal of the carrier substrate can be done by force to peel the substrate off, or may be assisted using ultrasonic vibration in a liquid medium.

Suitable carrier substrates include a flexible film, a plate or a disk with at least one flat side. This substrate preferably has a surface roughness of no more than the micron range. Suitable materials for the carrier substrate can be organic or inorganic in nature.

When the adhesive is thermally hardened, good thermal resistance of the carrier substrate up to at least 100° C., and preferably up to 150° C., is desirable. Furthermore, dimensional stability, particularly in terms of the coefficient of thermal expansion, is required during the heat hardening process. Depending on the dimensional tolerance of the pattern in the transfer process, a coefficient of thermal expansion in the range of less than $100 \times 10^{-6}$ in/in is especially preferred, and a value of less than $50 \times 10^{-6}$ in/in is more preferred for integrated circuit fabrication. Therefore, suitable materials for use as the carrier substrate in the presence of a heat hardenable adhesive include glasses, ceramics or thermal resistant plastics. The carrier substrate should have a flat surface and thermal properties which satisfy the above requirements.

When the adhesive, is radiation hardened, the carrier substrate should be transparent to radiation of the desired wave length. This method is superior in quality and ease of handling when compared to heat hardening method particularly in view of the concerns with thermal dimensional stability of the substrate. A transmission of no less than 30% is preferred to achieve efficient hardening. Radiation sources commonly used for UV curing of coatings or photolithography during printed circuit and integrated circuit production or printing plate making can be used. Typical radiation sources include a Mercury-Xenon lamp, or a Mercury arc lamp with major output at 365 nm wavelength.

Suitable carrier substrate materials for use during photoradiation hardening of the adhesive include glasses, and flexible polymers with high optical transparency such as polymethyl methacrylate, polycarbonate or polyolefins or polyesters etc. of amorphous structure.

Adhesives useful in the present invention are non-volatile liquid adhesives with a boiling point greater than 100° C., preferably higher than 150° C. A high boiling point is particularly preferred for heat hardened adhesive. The adhesives should have a viscosity at room temperature which is less than 10,000 cps, preferably less than 5000 cps. Viscosity which is too high tends to cause difficulties, particularly when alignment between the receiver and carrier substrates is required.

Suitable heat hardenable adhesives include those crosslinkable compounds which produce no volatile side products during a heat hardening process. These adhesives include, but are not limited to, epoxy, unsaturated ester, vinyl or acrylic compounds.

Suitable radiation hardenable adhesives particularly with an ultraviolet light source, include photo-polymerizable vinyl, allyl or acrylate compounds. These compounds are preferably to possess multiple photo-active unsaturated groups. Other suitable adhesives include epoxy resins containing photo-sensitive catalysts such as onium salts and iodonium salts. Suitable photo-hardenable adhesives can be selected from a wide variety of compounds such as those described in the literature, e.g., "Photopolymerization of Surface Coatings" by C.G. Roffey, John Wiley & Sons, 1982. However, adhesive compounds which give off large quantities of volatile side products during hardening or contain a high amount of oxygen plasma etch resistant materials, e.g., inorganic compounds, are of limited use in the present invention.

Before the lamination of the carrier substrate to the receiver substrate occurs, the adhesive is first applied to either substrate, for example, by dropping the adhesive with a dispenser on the substrate. Optionally, the adhesive can be pre-coated on the substrate. A vacuum can be applied to eliminate any trapped bubbles before and during the lamination process.

A mechanical and optical alignment mechanism, commonly called a mask aligner, which is commonly used in contact printing in the fabrication of integrated circuits can be adapted to perform the lamination and any alignment, as well as the hardening of the adhesive in the present invention.

A transparent carrier substrate is preferred when optical alignment is required. Radiation hardening with a transparent carrier substrate is particularly preferred as it allows fast fixing of the relative position of the two substrates. After hardening of the adhesive, the carrier substrate can be removed by various methods.

The simplest and the most effective method of removal is the use of mechanical force to peel the carrier substrate off the laminate. In general, the use of an adhesion promoting primer coating prior to the application of photoresist layer to the carrier substrate is not preferred when mechanical peeling is used.

Other methods include plasma etching or chemical etching of the inorganic carrier substrate, or the use of a depolymerizable polymeric carrier substrate. The depolymerizable polymers should have a low ceiling temperature not far from room temperature. Examples of such depolymerizable polymers include polyaldehydes or polysulfones, which, upon heating, degrade by chain scission to form volatile fragments. Vacuum condition should be used to accelerate the thermal depolymerization process. Plasma or chemical methods should not affect the organic material under the carrier substrate.

(iv) The fixtures of FIGS. (1-H) or (1-I) are then subjected to a plasma etching reaction, in particular, oxygen reactive ion etching, in order to remove materials on the receiver substrate which are not protected by the etch resistant pattern. The resulting pattern carrying receiver substrates are shown in FIGS. (1-J) and (1-K) correspond to th fixtures schematically shown in FIGS. (1-H) and (1-I) respectively. The receiver substrate should be resistant to oxygen plasma or oxygen reactive ion etching conditions. This substrate is preferably an inorganic material or an organo- metallic compound.

Of course, various methods used in the integrated circuit manufacturing industry can also be incorporated into this invention. These include image reversal, top imaging and selective inclusion of etch resistant compounds in the photoresist layer or the adhesive layer. The etch resistant compound is usually an organo-metallic compound which forms an etch resistant metal oxide during dry developing in an oxygen plasma or oxygen reactive ion etching chamber.

With an image reversible photoresist, usually a positive working, diazoquinone/novolac or polyvinylphenol based system, the photo exposed area can be rendered insoluble in a developer by the decarboxylation reaction of the photo-converted diazoquinone compound using heat. The unexposed area is then rendered soluble in aqueous alkali by flood radiation. Such a scheme facilitates good control of the resist pattern profile and can be used in this invention.

Unless otherwise specified, the components and methods hereinafter described, will be the same as those described in this first embodiment.

A further embodiment of the invention consists of the following:

In using an etch resistant, image reversible photoresist including the commercially available, AZ 5214 of Hoechst, USA, and those disclosed in U.S. Pat. Nos. 4,196,003 and 4,104,070 (the disclosure of which are incorporated by reference), the same procedure as previously described for a single layer photoresist is generally followed. However, a post-exposure baking is conducted as shown in FIG. (2-A), wherein the etch resistant photoresist thin film (7) is patterned on a transparent carrier substrate (2). The exposed portion (8) is rendered insoluble to alkali developer, while the unexposed portion remains unchanged in composition during the post-exposure baking. After lamination of the pattern bearing carrier substrate (2) to the receiver substrate (6) with an adhesive (5) as shown in FIG. (2-B), the adhesive is hardened using flood photo irradiation. This treatment simultaneously renders the unexposed portion (9) of the photoresist layer alkali soluble. Alternatively, the flood irradiation may be conducted prior to lamination of the post-exposure baked photoresist to the receiver substrate. After the carrier substrate is removed, a negative tone pattern (8) is resolved on the adhesive layer (5) as shown in FIG. (2-C). Subsequent dry developing using oxygen plasma etching will produce a pattern directly on the receiver substrate as described previously and demonstrated in FIG. (1-K).

A further embodiment of the present invention utilizes both image reversal and top imaging and is described as follows. As shown in FIG. (3-A), an etch resistant photoresist layer (10) is patterned on carrier substrate (2). The exposure of the resist layer is controlled so the exposed portion (11) does not reach the bottom of the resist layer which is in contact with the substrate. In general, such a top imaging scheme can be carried out by the incorporation of an absorbing dye into the photoresist layer which has a strong absorbance at the wavelength of the patterning radiation. Alternatively, top-imaging can be done by under-exposure of the resist film. After formation of the latent image, the same procedure described for the image reversal scheme is carried out. However, after the adhesive (5) is radiation hardened, as shown in FIG. (3-B), the portion of the photoresist layer in contact with the carrier substrate (2) is soluble in alkali developer. This is a consequence of the image reversal. This design facilitates the easy removal of the carrier substrate in an aqueous alkali solution. Further development of the pattern to clean off the soluble portion follows after the carrier substrate has been removed. The resulting item, as shown in FIG. (3-C), is then subjected to plasma etching as described previously.

Still another embodiment of the present invention is a Photoresist which possesses no etch resistant character. This material can be used in the present invention as long as a selective incorporation of etch resistant material into the photoresist layer on the receiver substrate can be accomplished prior to dry development. The selective inclusion of the etch resistant material in the photoresist layer is generally defined by the photochemical reaction in the pattern imaging step. For instance, the formation of indene carboxylic acid in the radiation exposed portion of a common diazoquinone/novolac positive photoresist will be more receptive to the inclusion of an amino silane, such as hexamethyl disilazane, than the non-irradiated portion. For a negative photoresist, the photo polymerization in the irradiated area will be less receptive to the etch resistant material than the non-irradiated area due to the increase in molecular weight.

One such scheme can be described as follows. As shown in FIG. (4-A), the etch resistant compound is selectively included in the exposed area (13) of a patterned photoresist layer (12) on a carrier substrate (2). After lamination, hardening of adhesive and removal of the carrier substrate, the fixture is ready for plasma etching without any wet developing of the photoresist layer as shown in FIG. (4-B). The etch resistant material containing area (13) is the protective mask for subsequent dry developing of the receiver substrate. The result is shown in FIG. (4-C). Alternatively, when the selective inclusion of the etch resistant material is in the unexposed area of the photoresist layer, the dry developed pattern on receiver substrate (6) is shown in FIG. (4-D). Photoresists which are capable of this type of selective inclusion of etch resistant material include, those disclosed in U.S. Pat. Nos. 4,613,398 and 4,552,833 (the disclosures of which are incorporated herein by reference) and commercial photoresists such as Plasmask of UCB Electronics. Typically the inclusion of an etch resistant compound, such as compounds containing silicon, tin or titanium atoms, is conducted by preferentially coupling an amino functional group on the organo-metallic compound with the phenoxy group in the novolac resin of the exposed portion of a positive working photoresist layer. Other inorganic compounds for selective inclusion suitable for this invention with a negative working photoresist can be those containing functional group such as amino, carboxylic acid, hydroxy and oxirane. Therewith, the photoresist should contain corresponding functional group, such as oxirane group for amino or carboxylic acid group containing etch resistant organometallic compound, or amino group for oxirane containing etch resistant organometallic compound.

The selective inclusion is not necessarily controlled by the difference created by the photo-reaction. As shown in FIG. (4-E), the photoresist layer (14) on carrier substrate (2) is doped non-selectively with etch resistant materials in the top surface region as represented by the dotted shade. A latent image is then formed by pattern exposure to photo radiation as shown in FIG. (4-F), where the slash shaded areas are the exposed portion. The exposed area is developed as shown in FIG. (4-G) for a positive working photoresist. Alternatively, a negative working photo resist can also be used and a reverse tone of pattern will be obtained.

In general, the inclusion of the etch resistant compound should not interfere with the patterning of the photoresist. That is, the etch resistant compound should not react with the diazoquinone functionality to destroy the capability of photo conversion into a carboxyl containing moiety for a positive photoresist. Therefore, the etch resistant compound can be, for example, a compound containing silicon, tin or titanium which is reactive towards groups on the photoresist. An example of this is the coupling reaction of a phenoxy group on the novolac resin with an aminosilane. Alternatively, the etch resistant compound can be non-reactive. In this case it is embedded in the photoresist layer by, for example, liquid phase diffusion while soaking in a metal salt solution. This type of etch resistant material stays inert during photo imaging subsequent developing steps.

For a negative working photo-resist, the same principles apply. In addition, the etch resistant compound can be photo-reactive so that it reacts during the photo-initiated crosslinking reaction. Alternatively, a non-reactive etch resistant compound may be used which remains inert during the imaging and developing steps.

A procedure as previously described then follows, including lamination, and hardening of the adhesive. The resulting structure after removal of the carrier substrate is shown in FIG. (4-H) for a positive working photoresist. It should be note that the etch resistant material rich surface layer (14) of the pattern is now positioned downward and in contact with the adhesive layer (5) on the receiver substrate (6).

After the plasma etching reaction, the pattern is transferred onto the receiver substrate as shown in FIG. (4-I). The etch resistant compound layer (15) in the photoresist pattern protects the adhesive layer (5) defined by the pattern.

Another embodiment of the present invention allows the addition of etch resistant materials to an image reversible, positive working photoresist to be carried out after the lamination and removal of the carrier substrate. As shown in FIG. (5-A), the etch resistant layer (17) is formed non-selectively in the outer surface of the patterned photoresist layer (16). The slash shaded region is the photo imaged region and is rendered insoluble to alkali developer by the method described previously for the image reversal process. The photo resist layer is then developed to remove the portion of the photoresist layer rendered soluble to alkali developer by the exposure to flood irradiation before or during the hardening process of the adhesive. The resulting structure is shown in FIG. (5-B), where the developed photoresist pattern on top of the adhesive layer (5) has an etch resistant material rich top layer (17) to protect the materials underneath. The resulting pattern defined by subsequent dry developing is shown in FIG. (5-C).

In another embodiment of the present invention, an imagewise inclusion scheme of etch resistant material can be used in conjunction with top imaging and image reversal techniques, as shown in FIG. (6-A). The photoresist layer (18) on carrier substrate (2) has the top-imaged portion embedded with an etch resistant material (19). After decarboxylation baking, and lamination, as shown in FIG. (6-B), both the unexposed area in photoresist layer (18) and liquid adhesive layer (5) are photo irradiated. Thus, while the adhesive is being hardened, the photoresist layer (18), except for the top imaged portion containing etch resistant material, becomes soluble in alkali developer. The carrier substrate (2) is then removed and the pattern is developed in an alkali developer as shown in FIG. (6-C). An etch resistant photoresist pattern (19) can then define the pattern on receiver substrate (6). After oxygen plasma etching, the resulting pattern of the receiver substrate is shown in FIG. (6-D).

In a final embodiment, the adhesive is receptive towards the etch resistant material. In this case, the pattern defined by the photoresist has no etch resistant character. For example, FIG. (7-A) shows a structure similar to that of FIG. (1-H) for a positive photo resist (20) with no etch resistant character. The exposed surface of adhesive layer (5) is embedded with an etch resistant material, represented by the dots. This forms an etch resistant top layer (21) after removal of the carrier substrate. Dry developing is then carried out in a plasma etch reactor to provide a reverse pattern from the photoresist pattern (20) on the receiver substrate (6) as shown in FIG. (7-B). Alternatively, a negative working photoresist can be used. In this case, a reverse pattern from that shown in FIG. (7-B) will be obtained.

In addition, a non-selective inclusion of an etch resistant material in both the positive photoresist pattern (20) and the adhesive area (5) can be used, provided that the inclusion of the etch resistant material does not destroy the solubility of the photoresist pattern in an aqueous alkali developer solution. The photoresist pattern (20), which now has its top surface rich in etch resistant compound and will be developed by an alkali developer. The subsequent dry developing will produce the same result as shown in FIG. (7-B).

Still another scheme where the adhesive is used to carry the etch resistant pattern is derived from a combination of the top imaging and image reversal schemes described previously, see e.g., FIGS. (3-A) through FIG. (3-C). In this version, the image reversible photoresist is not etch resistant in nature. It can be a commonly used commercial product such as AZ 5214. FIG. (7-C) shows the laminated product where the carrier substrate has been removed and the soluble portion of the photoresist layer has been washed off in developer. Resist pattern (22) is the top imaged portion which was rendered insoluble in alkali developer by heat as described previously. The dotted area (23) represents an etch resistant material rich region produced by gas phase or liquid phase diffusion into the exposed adhesive layer after the soluble photoresist portion has been removed by washing. Subsequent plasma etching will develop a corresponding pattern, as shown in FIG. (7-D), on the receiver substrate (6).

A suitable adhesive for use in the above mentioned two designs can be selected from those described earlier. The selectivity with respect to the adsorption or diffusion of the etch resistant material for the adhesive must be higher than that of the photoresist.

Preferably, a coupling reaction between the adhesive and the etch resistant organometallic compound occurs during the adsorption or diffusion process, provided that the photoresist contains no such functional group which is reactive with the organometallic compound.

Therefor, a suitable combination of functional groups on the adhesive and the etch resistant organometallic compound can be, for example, epoxy and amino groups, epoxy and anhydride groups, epoxy and carboxylic acid groups, hydroxy and isocyanate vinyl and thiol groups, allyl and thiol or acrylate and thiol groups. Various other combinations can also be effectively used, particularly in the presence of heat or a catalyst.

It is to be understood that the embodiments described herein are merely illustrative of the present invention. Various modifications may be made to the invention by persons skilled in the art which embody the principles of the invention and fall within the spirit and scope thereof.

EXAMPLE

The following example uses an image reversible photoresist containing an etch resistant compound, to illustrate the concept of the embodiments of the present invention.

The photoresist used has the following composition:

|  | part by wt. |
|---|---|
| AZ 5214 (Hoechst, USA) | 100 (dried) |
| poly(phenylsilsequioxane) | 25 |
| cis(1,3,5,7-tetrahydroxy)-1,3,5,7,-cyclotetrasiloxane | 50 |

The etch resistant composition was prepared with a solid content of 27% using propylene glycol monomethyl ether acetate as the solvent. The photoresist was applied to a thin glass plate by a spin coater (Headway Research Inc.) at 4000 rpm for 25 sec. A thin film of a thickness of approximately 1 um was obtained. Soft baking was then conducted in a convection oven at 80° C. for 16 min. An Oriel mask aligner 85240 which has a light source at 220–320 nm was used to print with an emulsion type mask carrying a 5 um line and space pattern. Exposure time was 80 sec, which corresponds to 35 mJ/cm$^2$.

Post exposure baking in a convection oven at 90° C. for 20 min was conducted before lamination onto a silicon wafer using a UV hardenable adhesive. The adhesive was composed of 100 parts by weight of trimethylol propane triacrylate supplied by Aldrich and 10 parts by weight of benzyl dimethyl ketal supplied by Ciba-Geigy, Limited. The laminate was gently pressed with a finger to minimize the thickness of the adhesive layer before exposure to the ultraviolet light used to harden the adhesive. The hardening light source used was a 3 KW ORC HMW 532 photo printer with a major output at 365 nm. A dosage of 500 mJ/cm$^2$ was used. The carrier glass plate was then pulled off and the laminate was immersed for approximately 30 sec in a 4% aqueous solution of tetramethyl ammonium hydroxide in order to develop the photoresist pattern. The pattern carrying silicon wafer was then subjected to oxygen plasma etching in a plasma reactor (Plasmalab series, with the radio frequency power supplier voltage 80) for 15 min at an oxygen gas flow rate of 20 SCCM (standard condition cc/min) with a DC bias of 330 volts. The resulting sample was examined under an optical microscope and by Talystep (Taylor Habson) to observe the well defined pattern.

What is claimed is:

1. A method for preparing a resist pattern on a substrate comprising the steps of:
   (a) forming an etch resistant photoresist layer on a transparent flat carrier substrate;
   (b) forming an latent pattern in the resist layer by imagewise exposure to photo radiation;
   (c) developing said latent pattern using an appropriate solvent to provide an explicit pattern on the carrier substrate;
   (d) laminating the photo resist bearing substrate to an etch resistant receiver substrate using a photo hardenable organic liquid adhesive, with the photoresist side facing the receiver substrate;
   (e) photo-hardening the adhesive layer by flood exposure of the adhesive layer to photo-radiation where the photo-radiation is transmitted through the carrier substrate;
   (f) peeling off the carrier substrate; and
   (g) providing a resist pattern on the receiver substrate by oxygen reactive ion etching the laminated pattern.

2. A method according to claim 1, wherein said photoresist layer contains at least 4% by weight, based on the photoresist layer, of silicon atoms which form etch resistant silicon oxide on exposure to oxygen plasma.

3. A method according to claim 1, wherein said carrier substrate is made of materials selected from the group consisting of inorganic glass and amorphous organic compounds and is transparent to said photoradiation.

4. A method according to claim 1, wherein said etch resistant photoresist is image reversible, and is selected from the group consisting of naphthoquinone diazide/novolac and naphtoquinone/polyvinylphenol based photoresist, wherein said photoresist contains a non-photo active etch resistant silicon compound, and said latent pattern is first thermally treated for decarboxylation and wet developed only before dry etching in oxygen plasma.

5. A method according to claim 4, wherein said latent pattern resides in the top surface layer relative to the carrier substrate of the photoresist layer.

6. A method according to claim 1, wherein said liquid adhesive is a photopolymerizable organic compound with a boiling point greater than 100° C.

* * * * *